(12) United States Patent
Cho et al.

(10) Patent No.: US 8,274,176 B2
(45) Date of Patent: Sep. 25, 2012

(54) POWER SUPPLY APPARATUS

(75) Inventors: Jong-hwa Cho, Suwon-si (KR);
Joong-gi Kwon, Gunpo-si (KR);
Jong-yang Choo, Yongin-si (KR);
Chul-woo Oh, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 459 days.

(21) Appl. No.: 11/962,447

(22) Filed: Dec. 21, 2007

(65) Prior Publication Data

US 2009/0015062 A1 Jan. 15, 2009

(30) Foreign Application Priority Data

Jul. 13, 2007 (KR) .................. 10-2007-0070770

(51) Int. Cl.
*H02J 1/10* (2006.01)
(52) U.S. Cl. .......................................................... 307/43
(58) Field of Classification Search .................. 307/82, 307/43
See application file for complete search history.

(56) References Cited

U.S. PATENT DOCUMENTS

| | | | | |
|---|---|---|---|---|
| 4,481,566 A * | 11/1984 | Hoffman et al. | ................ | 363/60 |
| 5,699,236 A | 12/1997 | Choi | | |
| 5,815,771 A | 9/1998 | Dhande et al. | | |
| 6,420,954 B1 * | 7/2002 | Ahn et al. | ..................... | 336/232 |
| 6,900,994 B2 * | 5/2005 | Asayama | ................... | 363/21.01 |
| 7,058,333 B2 * | 6/2006 | Shin | ................................ | 399/88 |
| 7,369,419 B2 * | 5/2008 | Erbito, Jr. | ...................... | 363/60 |
| 2004/0108927 A1 * | 6/2004 | Castaneda et al. | ............... | 336/10 |
| 2005/0260796 A1 * | 11/2005 | Takahashi | ..................... | 438/112 |
| 2005/0264959 A1 * | 12/2005 | Kim | ................... | 361/18 |
| 2006/0147222 A1 * | 7/2006 | Eom | ................................ | 399/88 |
| 2006/0176717 A1 | 8/2006 | Chae et al. | | |
| 2006/0182459 A1 | 8/2006 | Shin | | |
| 2007/0092284 A1 | 4/2007 | Choi | | |
| 2008/0231115 A1 * | 9/2008 | Cho et al. | ........................ | 307/41 |
| 2010/0020510 A1 | 1/2010 | Oh et al. | | |

FOREIGN PATENT DOCUMENTS

| | | |
|---|---|---|
| KR | 2002-0024444 | 3/2002 |
| KR | 10-2004-0043579 | 5/2004 |
| KR | 10-2006-0088774 | 8/2006 |
| WO | 02/25800 A1 | 3/2002 |

OTHER PUBLICATIONS

Office Action mailed Dec. 22, 2011 in co-pending U.S. Appl. No. 12/656,087.
Office Action mailed May 9, 2012 in co-pending U.S. Appl. No. 12/656,087.
Chinese Office Action mailed Mar. 1, 2012 in related Chinese Patent Application No. 200810005463.1.

* cited by examiner

*Primary Examiner* — Robert L. Deberadinis
(74) *Attorney, Agent, or Firm* — Staas & Halsey LLP

(57) ABSTRACT

In a provided power supply unit, a plurality of circuit elements are integrated into a chip, wherein the circuit elements generate one or more output voltages by using an input voltage. Thus, although the number of voltages, which can be generated by the power supply apparatus, is remarkably large, the power supply apparatus can be miniaturized. In addition, an apparatus, in which the power supply apparatus is installed, can be miniaturized.

12 Claims, 4 Drawing Sheets

POWER SUPPLY APPARATUS

CROSS-REFERENCE TO RELATED APPLICATIONS

This application claims the benefit of Korean Application No. 2007-70770, filed Jul. 13, 2007, in the Korean Intellectual Property Office, the disclosure of which is incorporated herein by reference.

BACKGROUND OF THE INVENTION

1. Field of the Invention

Aspects of the present invention relate to a power supply, and more particularly, to a power supply apparatus to generate at least one output voltage using an input voltage and to provide the generated output voltage.

2. Description of the Related Art

Power supplied to various electronic components of an electronic device can comprise direct current (DC) voltages that are different from one another. In this case, a power supply apparatus is provided in the electronic device, wherein the power supply apparatus generates the DC voltages to be supplied to the various electronic components by using an input voltage. The power supply apparatus includes various elements that receive the input voltage and generate the DC voltages different from one another by using the input voltage.

In a typical power supply apparatus, as the number of output voltages that can be generated by using an input voltage increases, the power supply apparatus is implemented on a circuit board having an increasing number of circuit elements arranged therein. In the typical power supply apparatus, the larger the number of output voltages that can be generated, the greater the size of the typical power supply apparatus. Therefore, it is difficult to miniaturize an electronic device that uses DC voltages that are different from one another, and thus, it is difficult to satisfy a recent trend in which miniaturized products hold a high market share.

SUMMARY OF THE INVENTION

Aspects of the present invention provide a power supply apparatus that is reduced in size, which generates one or more output voltages by using an input voltage.

According to an aspect of the present invention, a power supply apparatus includes a high voltage generating unit, which generates one or more output voltages by using an input voltage, and which is implemented as a chip; and one or more output terminals formed on a same circuit board as the high voltage generating unit, to output the generated one or more output voltages.

According to another aspect of the present invention, a power supply apparatus includes: a high voltage generating unit, which generates one or more output voltages by using an input voltage, and which is implemented as a module; and one or more output terminals disposed on a same circuit board as the high voltage generating unit, to output the generated one or more output voltages.

According to another aspect of the present invention, a power supply apparatus formed on a circuit board includes: a plurality of circuit components mounted on the circuit board; a solid-state electronic voltage converter mounted on the circuit board to convert an input voltage into one or more output voltages; and one or more output terminals mounted on the circuit board and corresponding to the one or more output voltages to output the one or more output voltages.

According to another aspect of the present invention, a solid state power supply apparatus includes: an input terminal to receive an input voltage; a voltage converter to convert the input voltage into one or more output voltages; and one or more output terminals to output the one or more output voltages and each corresponding to the one or more output voltages.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
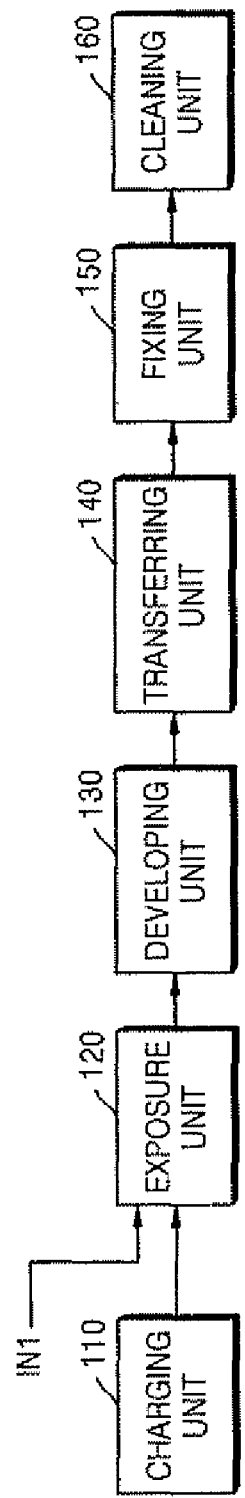
FIG. 1 is a block diagram of an image forming apparatus which represents a typical apparatus in which a power supply apparatus according to an aspect of the present invention can be installed.

Reference will now be made in detail to aspects of the present invention, examples of which are illustrated in the accompanying drawings, wherein like reference numerals refer to the like elements throughout. The aspects are described below in order to explain the present invention by referring to the figures.

FIG. 1 is a block diagram of an image forming apparatus which represents a typical apparatus in which a power supply apparatus according to an aspect of the present invention can be installed. The image forming apparatus may include a charging unit 110, an exposure unit 120, a developing unit 130, a transferring unit 140, a fixing unit 150, and a cleaning unit 160.

The power supply apparatus receives an input voltage, and outputs one or more output voltages by using (or converting) the input voltage. The image forming apparatus is an apparatus having a print function (e.g., a printer and/or a multi function peripheral (MFP) having a print function). Hereinafter, the image forming apparatus is assumed to be a laser beam printer (LBP) that performs single-color printing, for convenience of description. However, in other aspects, other devices having plurality of components are within the scope of the present invention, such as a personal computer.

In reference to FIG. 1, the charging unit 110 regularly charges an entire surface of a photoconductive drum (not shown) installed in the image forming apparatus with a charge of a predetermined polarity. Then, the exposure unit 120 performs exposure with respect to the entire surface of the photoconductive drum according to print data input through an input terminal IN 1 so that an electrostatic latent image (not shown) is formed to correspond to the print data on the surface of the photoconductive drum. The electrostatic latent image has a predetermined polarity (e.g., positive (+)).

The developing unit 130 develops the electrostatic latent image, which is formed on the surface of the photoconductive drum by the exposure unit 120, using a developer (e.g., toner) so that a developed image (not shown) is formed. The developer has a predetermined polarity (e.g., negative (−)). The transferring unit 140 transfers the developed image, which is formed on the surface of the photoconductive drum by the developing unit 130, onto a printing medium (not shown). The printing medium is a medium to be printed, and may be paper, an overhead projection (OHP) film, or the like. The fixing unit 150 fixes the developed image onto the printing medium, which is transferred onto the printing medium by the transferring unit 140. In particular, the fixing unit 150 fixes the developed image onto the printing medium using heat and pressure.

The cleaning unit 160 operates after the operation of the transferring unit 140 is finished, and removes the developer left on the surface of the photoconductive drum. Ideally, all of the developer, by which the developed image is formed on the surface of the photoconductive drum, should be transferred onto the printing medium. However, a part of the developer can actually remain on the surface of the photoconductive drum even after the transferring operation is finished. After the operation of the transferring unit 140 is finished with respect to the print data input through an input terminal IN 1 for an nth time (where n is a natural number), the developer left on the surface of the photoconductive drum deteriorates the print quality of a printed matter with respect to the print data, which is input through the input terminal IN 1 at an n+1th time. Thus, prior to the operation of the exposure unit 120 with respect to the print data input for the n+1th time, the developer left on the surface of the photoconductive drum may be clearly removed by the cleaning unit 160.

The charge unit 110, the exposure unit 120, the developing unit 130, the transferring unit 140, the fixing unit 150, and the cleaning unit 160 are components of the image forming apparatus. Each of the charging unit 110, the exposure unit 120, the developing unit 130, the transferring unit 140, the fixing unit 150, and the cleaning unit 160 are electronically operated using received power. In being electronically operated, the voltage of the power to be supplied to each of the charging unit 110, the exposure unit 120, the developing unit 130, the transferring unit 140, the fixing unit 1 50, and the cleaning unit 160 may be different from one another.

Figure 2:
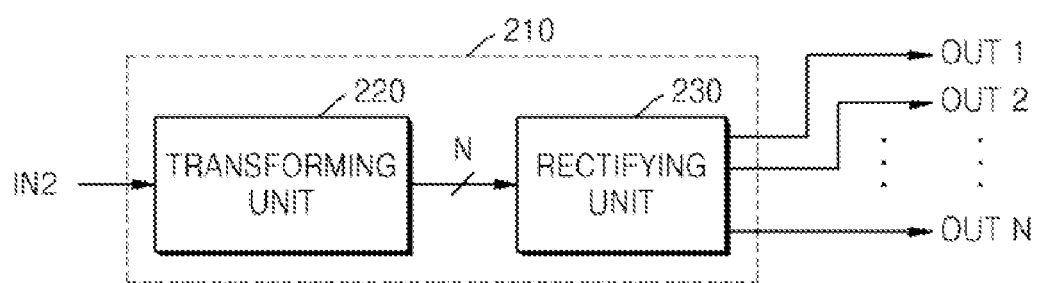
FIG. 2 is a block diagram of a power supply apparatus according to an aspect of the present invention.

FIG. 2 is a block diagram of a power supply apparatus according to an aspect of the present invention. The power supply apparatus includes an input terminal IN 2, a high voltage generating unit 210 (also referred to as a high voltage generator unit 210, or a voltage generator 210), and a plurality of output terminals OUT 1 through OUT N (where N is an integer and N≧2).

In reference to FIG. 2, the high voltage generating unit 210 generates one or more voltages (i.e., n voltages, where n is a natural number) using a voltage input through the input terminal IN 2, and outputs the generated voltages through the output terminals OUT 1 through OUT n.

The high voltage generating unit 210 is implemented not as 'a plurality of circuit elements discretely distributed on a circuit board,' but rather, as 'a module disposed on a circuit board'. For example, the high voltage generating unit 210 is implemented as 'a chip disposed on a circuit board'.

The high voltage generating unit 210 includes a transforming unit 220 and a rectifying unit 230. The transforming unit 220 transforms a voltage input through the input terminal IN 2 into one or more output voltages (i.e. n voltages), which if more than one, is different from one another, though not required. In other aspects, two or more output voltages may be the same.

The rectifying unit 230 rectifies the n voltages output from the transforming unit 220, and outputs the rectified voltages through the output terminals OUT 1 through OUT n. That is, the rectifying unit 230 rectifies each of the n voltages output from the transforming unit 220, determines the n voltages as 'the n voltages generated by the high voltage generating unit 210' referred to above, and outputs the determined n voltages through the output terminals OUT 1 through OUT n as n output voltages. In various aspects, the respective output terminals OUT 1 through OUT n may respectively output the n output voltages.

In an aspect of the present invention, the input terminal IN 2, the high voltage generating unit 210, and the output terminals OUT 1 through OUT N are all disposed on a same circuit board. In other aspects, the input terminal IN 2, the high voltage generating unit 210, and the output terminals OUT 1 through OUT n are all disposed on a single platform, such as a chip or a module. If disposed on a chip or a module, the chip or the module may be a solid state device. In various aspects, the chip may be an integrated circuit, which may be based on a ceramic or a non-conducting substrate. In various aspects, the module may be a self-contained electronic device with one or more subcomponents.

If the power supply apparatus according to the present invention is installed in the image forming apparatus as shown in FIG. 1, for example, at least one of the output terminals OUT 1 through OUT n (e.g., n=4), is connected to at least one of a plurality of electronic components (e.g., the charging unit 110, the exposure unit 120, the developing unit 130, the transferring unit 140, the fixing unit 150 and the cleaning unit 160) installed in the image forming apparatus. At this time, the plurality of electronic components may be directly connected to the output terminals OUT 1 through OUT n, or may be connected by wires thereto.

Figure 3:
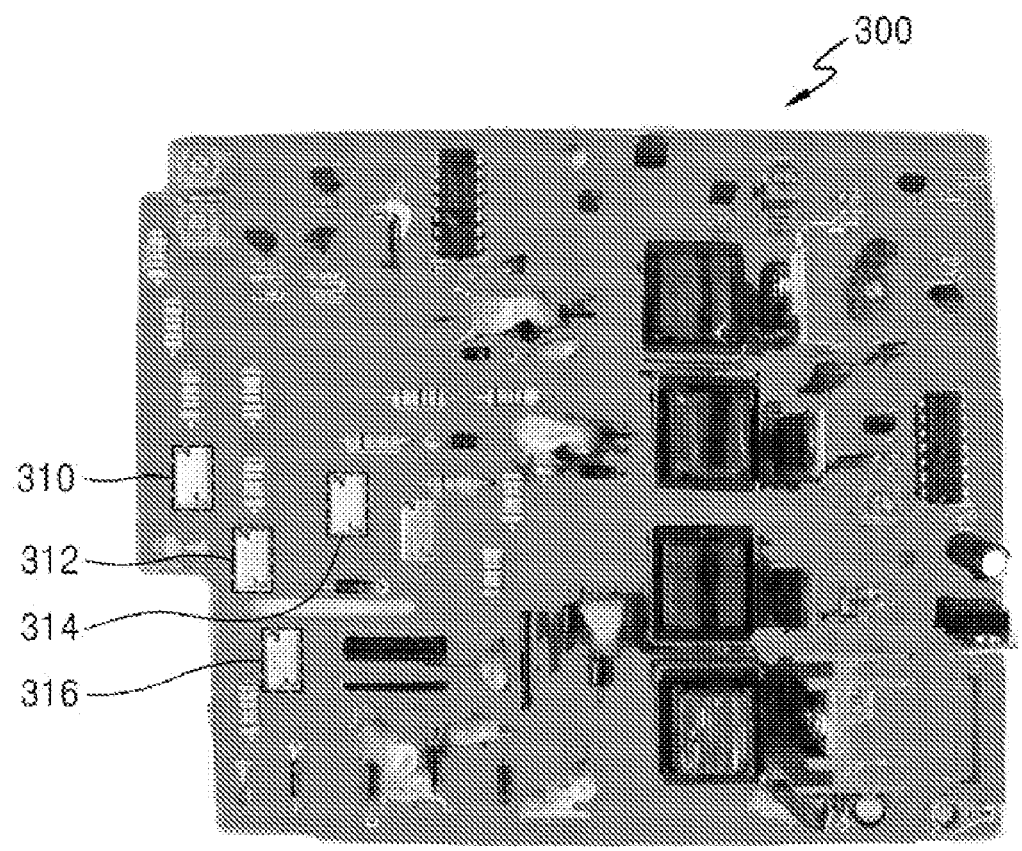
FIG. 3 is a view illustrating a circuit board implementing a typical power supply apparatus.

FIG. 3 is a view illustrating a circuit board 300 implementing a typical power supply apparatus. Referring to FIG. 3, the typical power supply apparatus is implemented on the circuit board 300. Accordingly, 'an input terminal (not shown)', 'a plurality of output terminals 310, 312, 314, and 316', and 'a plurality of circuit elements discretely distributed on the circuit board 300' are provided on the circuit board 300 that includes the typical power supply apparatus.

Figure 4:
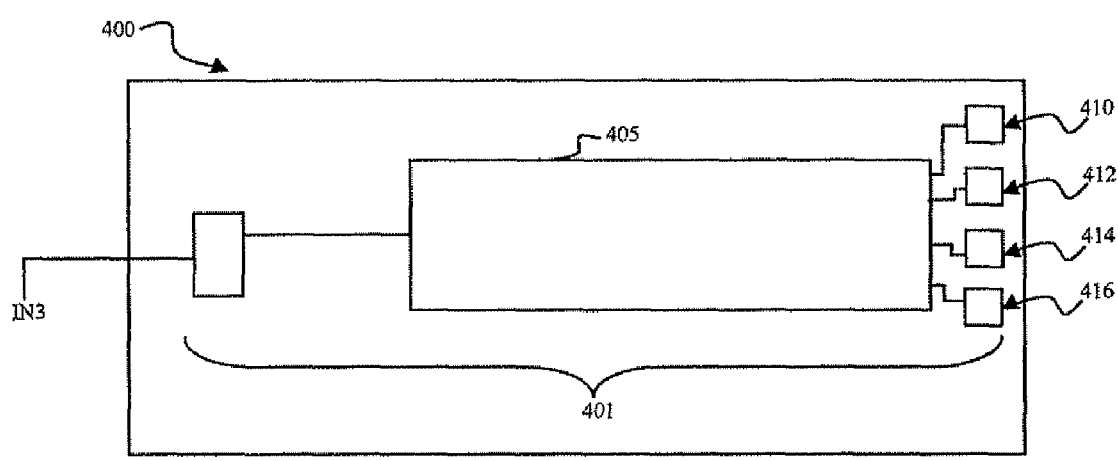
FIG. 4 is a view illustrating a circuit board on which a power supply apparatus according to an aspect of the present invention is implemented.

FIG. 4 is a view illustrating a circuit board 400 on which a power supply apparatus 401 according to an aspect of the present invention is implemented. As shown, 'an input terminal IN 3', 'a plurality of output terminals 410, 412, 414, and 416' and 'a module 405 (e.g., a chip)' are provided on the circuit board 400, unlike the circuit board 300 of FIG. 3. In aspects of the present invention, the module 405 may be the high voltage generating unit 210 of FIG. 2. In aspects of the present invention, the number of output terminals may be any number.

An area of the circuit board 300, on which the typical 'circuit elements discretely distributed on the circuit board 300' are occupied, would be wider than an area of the circuit board 400, on which the 'module 405' according to the present invention is occupied.

As described above, a plurality of circuit elements are implemented as a module in the power supply apparatus according to aspects of the present invention, wherein the circuit elements generate one or more voltages using an input voltage. For example, the circuit element is implemented as a module or a chip. Thus, although the number of voltages, which can be generated by the power supply apparatus, is remarkably large, the power supply apparatus can be miniaturized. In addition, an apparatus, in which the power supply apparatus is installed, can be miniaturized.

In various aspects, the high voltage generating unit 210 may be a voltage multiplier that may be on a chip, or may be a power converter that converts AC power to DC power, or DC power to DC power, etc.

Although a few aspects of the present invention have been shown and described, it would be appreciated by those skilled in the art that changes may be made in aspects without departing from the principles and spirit of the invention, the scope of which is defined in the claims and their equivalents.

What is claimed is:

1. A power supply apparatus comprising:
   a high voltage generating unit, which generates one or more output voltages by using an input voltage, and which is implemented as a chip; and
   one or more output terminals formed on a same circuit board as the high voltage generating unit, to output the generated one or more output voltages,
   wherein the chip comprises:
      a transforming unit to transform the input voltage into one or more transformed voltages that are different from one another; and
      a rectifying unit to rectify the transformed voltages into rectified voltages, and to determine the rectified voltages as the generated one or more output voltages,
   wherein the one or more output terminals are installed in an image forming apparatus, and each of the output terminals is connected to at least one of a plurality of electronic components of the image forming apparatus directly or through an electric wire, and
   wherein the plurality of electronic components include a charging unit, an exposure unit, a developing unit, a transferring unit, a fixing unit and a cleaning unit.

2. The apparatus of claim 1, wherein the image forming apparatus is an apparatus having a print function.

3. The apparatus of claim 1, wherein the image forming apparatus includes a printer or a multi function periphera (MFP).

4. The apparatus of claim 1, wherein two or more of the output voltages are the same.

5. The apparatus of claim 1, wherein the output voltages are direct current (DC) voltages 6. The apparatus of claim 1, wherein the high voltage generating unit is a voltage multiplier that is on the chip.

7. The apparatus of claim 1, wherein the high voltage generating unit is a power converter.

8. The apparatus of claim I wherein the high voltage generating unit c onverts AC power to DC power.

9. The apparatus of claim 1, wherein the high voltage generating unit converts DC power to AC power.

10. A power supply apparatus comprising:
    a high voltage generating unit, which generates one or more output voltages by using an input voltage, and which is implemented as a module; and
    one or more output terminals disposed on a same circuit board as the high voltage generating unit, to output the generated one or more output voltages,
    wherein the module comprises:
       a transforming unit to transform the input voltage into one or more transformed voltages that are different from one another; and
       a rectifying unit to rectify the transformed voltages, and to determine the rectified voltages as the generated one or more output voltages,
    wherein the one or more output terminals are installed in an image forming apparatus, and each of the output terminals is connected to at least one of a plurality of electronic components of the image forming apparatus directly or through an electric wire, and
    wherein the plurality of electronic components include a charging unit, an exposure unit, a developing unit, a transferring unit, a fixing unit and a cleaning unit.

11. A power supply apparatus formed on a circuit board comprising:
    a plurality of circuit components mounted on the circuit board;
    a solid-state electronic voltage converter mounted on the circuit board to convert an input voltage into one or more output voltages, and which is implemented as a chip; and
    one or more output terminals mounted on the circuit board and corresponding to the one or more output voltages to output the one or more output voltages,
    wherein the solid-state electronic voltage converter implemented as the chip comprises:
       a transformer to transform the input voltage into one or more transformed voltages that are different from one another; and
       a rectifier to rectify the transformed voltages into corresponding rectified voltages, and outputting the corresponding rectified voltages as the one or more output voltages, respectively,
    wherein the one or more output terminals are installed in an image forming apparatus, and each of the output terminals is connected to at least one of a plurality of electronic components of the image forming apparatus directly or through an electric wire, and
    wherein the plurality of electronic components include a charging unit, an exposure unit, a developing unit, a transferring unit, a fixing unit and a cleaning unit.

12. A solid state power supply apparatus comprising:
    an input terminal to receive an input voltage;
    a voltage converter to convert the input voltage into one or more output voltages and implemented as a chip; and
    one or more output terminals to output the one or more output voltages and each corresponding to the one or more output voltages,
    wherein the voltage converter implemented as the chip comprises:
       a transformer to transform the input voltage into one or more transformed voltages that are different from one another; and
       a rectifier to rectify the transformed voltages into corresponding rectified voltages, and outputting the corresponding rectified voltages as the one or more output voltages, respectively,
    wherein the one or more output terminals are installed in an image forming apparatus, and each of the output terminals is connected to at least one of a plurality of electronic components of the image forming apparatus directly or through an electric wire, and
    wherein the plurality of electronic components include a charging unit, an exposure unit, a developing unit, a transferring unit, a fixing unit and a cleaning unit.

* * * * *

UNITED STATES PATENT AND TRADEMARK OFFICE
CERTIFICATE OF CORRECTION

PATENT NO.       : 8,274,176 B2                              Page 1 of 1
APPLICATION NO.  : 11/962447
DATED            : September 25, 2012
INVENTOR(S)      : Jong-hwa Cho et al.

It is certified that error appears in the above-identified patent and that said Letters Patent is hereby corrected as shown below:

In the Claims:

Column 5; Line 39 (Approx.); In Claim 3, delete "periphera" and insert -- peripheral --, therefor
Column 5; Line 45 (Approx.); In Claim 5, delete "voltages" and insert -- voltages. --, therefor
Column 5; Line 49 (Approx.); In Claim 8, delete "claim l" and insert -- claim 1, --, therefor.
Column 5; Line 50 (Approx.); In Claim 8, delete "c onverts" and insert -- converts --, therefor Signed and Sealed this
Fourteenth Day of May, 2013

Teresa Stanek Rea
*Acting Director of the United States Patent and Trademark Office*